(12) United States Patent
D'Andrade

(10) Patent No.: US 8,372,526 B2
(45) Date of Patent: Feb. 12, 2013

(54) INTERMEDIATE CONNECTOR FOR STACKED ORGANIC LIGHT EMITTING DEVICES

(75) Inventor: Brian D'Andrade, Westampton, NJ (US)

(73) Assignee: Universal Display Corporation, Ewing, NJ (US)

( * ) Notice: Subject to any disclaimer, the term of this patent is extended or adjusted under 35 U.S.C. 154(b) by 918 days.

(21) Appl. No.: 12/174,286

(22) Filed: Jul. 16, 2008

(65) Prior Publication Data
US 2010/0013378 A1    Jan. 21, 2010

(51) Int. Cl.
*H01L 51/54* (2006.01)
(52) U.S. Cl. ......... 428/690; 428/917; 313/502; 313/504
(58) Field of Classification Search .................. None
See application file for complete search history.

(56) References Cited

U.S. PATENT DOCUMENTS

| | | | |
|---|---|---|---|
| 5,707,745 A | 1/1998 | Forrest et al. | |
| 5,721,160 A | 2/1998 | Forrest et al. | |
| 5,917,280 A | 6/1999 | Burrows et al. | |
| 6,107,734 A * | 8/2000 | Tanaka et al. | 313/506 |
| 6,232,714 B1 | 5/2001 | Shen et al. | |
| 6,337,492 B1 | 1/2002 | Jones et al. | |
| 6,936,961 B2 | 8/2005 | Liao et al. | |
| 6,991,859 B2 | 1/2006 | Klubek et al. | |
| 7,075,231 B1 | 7/2006 | Liao et al. | |
| 7,173,369 B2 | 2/2007 | Forrest et al. | |
| 2004/0113547 A1 | 6/2004 | Son et al. | |
| 2005/0029933 A1* | 2/2005 | Liao et al. | 313/504 |
| 2006/0250079 A1* | 11/2006 | Kwok et al. | 313/506 |
| 2007/0046189 A1* | 3/2007 | Hatwar et al. | 313/506 |
| 2007/0103066 A1 | 5/2007 | D'Andrade et al. | |

FOREIGN PATENT DOCUMENTS

| | | | |
|---|---|---|---|
| JP | 2006066379 A * | 3/2006 | |
| WO | WO 2005/109542 | 11/2005 | |

OTHER PUBLICATIONS

Machine translation of JP2006-066379. Date of publication: Mar. 9, 2006.*
T. W. Canzler, M. Burghart, S. Murano, J. Blochwitz-Nimoth, B. D'Andrade, M. Hack, and J. J. Brown, "Highly power efficient organic light-emitting devices enabled by phosphorescent and p-i-n. technologies," San Diego, CA, United States, 2006 (International Society for Optical Engineering, Bellingham WA, WA 98227-0010, United States), p. 633311.
C.-C. Chang, J.-F. Chen, S.-W. Hwang, and C. H. Chen, "Highly efficient white organic electroluminescent devices based on tandem architecture," Applied Physics Letters 87, 253501 (2005).
C.-W. Chen, E. H.-E. Wu, C.-W. Chu, C.-C. Wu, and Y. Yang, "The mechanism and effective connecting architecture for tandem organic light-emitting devices," San Diego, CA, United States, 2005 (International Society for Optical Engineering, Bellingham, WA, WA 98227-0010, United States), p. 1-8.
H. Y. Chu, J.-I. Lee, L.-M. Do, T. Zyung, B.-J. Jung, H.-K. Shim, and J. Jang, "Organic white light emitting devices with an RGB stacked multilayer structure," Sendai, Japan, 2003 (Taylor and Francis Inc., Philadelphia PA, PA 19106, United States), p. 119-125.
B. D'Andrade and J. J. Brown, "White phosphorescent organic light emitting devices for display applications," Kissimmee, FL, United States, 2006 (International Society for Optical Engineering, Bellingham, WA, WA 98227-0010, United States), p. 622514.
T. K. Hatwar, J. P. Spindler, and S. A. Van Slyke, 1447: "High performance tandem OLEDs for large area full color AM displays and lighting applications," Daegu, South Korea, 2006 (Korean Information Display Society, 635-4 Yeogasm-Dong, Kangnam-gu, Seoul, 135-703, South Korea), p. 1577-1582.
T. K. Hatwar, J. P. Spindler, and S. A. Van Slyke, "Low-voltage white tandem structures for fabricating RGBW AMOLED displays," San Francisco, CA, United States, 2006 (Society for Information Display, San Jose, CA 95112-4006, United States), p. 1939-1942.
H. Kanno, Y. Hamada, K. Nishimura, K. Okumoto, N. Saito, H. Ishida, H. Takahashi, K. Shibata, and K. Mameno, "High efficiency stacked organic light-emitting diodes employing Li 2O as a connecting layer," Japanese Journal of Applied Physics, Part 1: Regular Papers and Short Notes and Review Papers 45, 9219-9223 (2006).
T.-W. Lee, T. Noh, B.-K. Choi, M.-S. Kim, D. W. Shin, and J. Kido, "High-efficiency stacked white organic light-emitting diodes," Applied Physics Letters 92, 043301 (2008).
L.-S. Liao, K. P. Klubek, M. J. Helber, L. Cosimbescu, and D. L. Comfort, Distinguished paper: "High-efficiency tandem blue OLEDs," San Francisco, CA, United States, 2006 (Society for Information Display, San Jose, CA 95112-4006, United States), p. 1176-1179.
L.-S. Liao, W. K. Slusarek, T. K. Hatwar, M. L. Ricks, and D. L. Comfort, "Tandem organic light-emitting diode using hexaazatriphenylene hexacarbonitrile in the intermediate connector," Advanced Materials 20, 324-329 (2008).
S. Murano, M. Burghart, J. Birnstock, P. Wellmann, M. Vehse, A. Werner, T. Canzler, T. Stubinger, G. He, M. Pfeiffer, and H. Boerner, "Highly efficient white OLEDs for lighting applications," San Diego, CA, United States, 2005 (International Society for Optical Engineering, Bellingham, WA, WA 98227-0010, United States), p. 1-8.
G. Schwartz, K. Walzer, M. Pfeiffer, and K. Leo, "High efficiency white organic light emitting diodes combining fluorescent and phosphorescent emitter systems," Strasbourg, France, 2006 (International Society for Optical Engineering, Bellingham WA, WA 98227-0010, United States), p. 61920.
J. X. Sun, X. L. Zhu, H. J. Peng, M. Wong, and H. S. Kwok, "Bright and efficient white stacked organic light-emitting diodes," Organic Electronics: physics, materials, applications 8, 305-310 (2007).

(Continued)

*Primary Examiner* — Dawn L. Garrett
*Assistant Examiner* — Andrew K Bohaty
(74) *Attorney, Agent, or Firm* — Kilpatrick Townsend & Stockton LLP

(57) ABSTRACT

A device is provided, having an anode, a cathode, and an intermediate connector disposed between the anode and the cathode. A first organic layer including an emissive sublayer is disposed between the anode and the intermediate connector, and a second including an emissive sublayer is disposed between the intermediate connector and the cathode. The intermediate connector includes a first metal having a work function lower than 4.0 eV and a second metal having a work function lower than 5.0 eV. The work function of the first metal is at least 0.5 eV less than the work function of the second metal. The first metal is in contact with a sublayer of the second organic layer that includes a material well adapted to receive holes from a low work function metal.

11 Claims, 4 Drawing Sheets

OTHER PUBLICATIONS

A. Werner, M. Burghart, S. Murano, O. Schneider, T. Stubinger, M. Limmert, and J. Blochwitz-Nimoth, "White OLED structures using molecularly doped charge transport layers," San Francisco, CA, United States, 2006 (Society for Information Display, San Jose, CA 95112-4006, United States), p. 1078-1081.

Zheng at al., "An effective intermediate Al/Au electrode for stacked color-tunable organic light emitting devices," Appl. Phys. A 91, 501-506 (2008).

Liao et al., "Tandem white OLEDs combining fluorescent and phosphorescent emission," SID 08 Digest, pp. 818-821, (2008).

Ho et al., "Highly efficient p-i-n white organic light emitting devices with tandem structure," Appl. Phys. Lett., 91, 233507 (2007).

Sun et al., "Effective intermediate layers for highly efficient stacked organic light-emitting devices," Appl. Phys. Lett. 87, 093504 (2005).

Walzer et al., "Highly efficient organic devices based on electrically doped transport layers," Chem. Rev. 2007, 107, 1233-1271.

* cited by examiner

INTERMEDIATE CONNECTOR FOR STACKED ORGANIC LIGHT EMITTING DEVICES

The present invention was made under Federal Contract Grant Nos. DE-FG02-06ER84582 and DE-FG02-05ER84263, both sponsored by the Department of Energy, and the government may have certain rights to the subject invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more specifically to an intermediate connector for stacked organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure of Formula I:

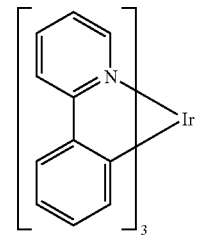

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, work functions are generally referred to as positive numbers, and a first work function is "greater than" or "higher than" a second work function if the first work function has a higher absolute value. Work functions are generally measured as negative numbers relative to vacuum level, with a correspondence similar to that of HOMO and LUMO energy levels relative to vacuum. However, work functions are routinely referred to by those of skill in the art as positive numbers corresponding to the absolute value of the measured quantity. On a conventional energy level diagram, with the vacuum level at the top, a "higher" work function is illustrated as further away from the vacuum level in the downward direction. Thus, the definitions of HOMO and LUMO energy levels follow a different convention than work functions. A "higher" work function and a "lower" HOMO energy level both correspond to downward movement on a conventional energy level diagram with vacuum level at the top.

More details on OLEDs, and the definitions described above, can be found in U.S. Pat. No. 7,279,704, which is incorporated herein by reference in its entirety.

SUMMARY OF THE INVENTION

A device is provided. The device includes an anode, a cathode and an intermediate connector disposed between the anode and the cathode. The intermediate connector includes a first metal having a work function lower than 4.0 eV and a second metal having a work function lower than 5.0 eV, where the work function of the first metal is at least 0.5 eV less than the work function of the second metal. A first organic layer is disposed between the anode and the intermediate connector. The first organic layer includes a first organic emissive material. A second organic layer is disposed between the intermediate connector and the cathode. The second organic layer includes a plurality of sublayers, including a first sublayer of the second organic layer and a second sublayer of the second organic layer. The first sublayer of the second organic layer is in direct contact with the intermediate connector, and comprises a material having the structure:

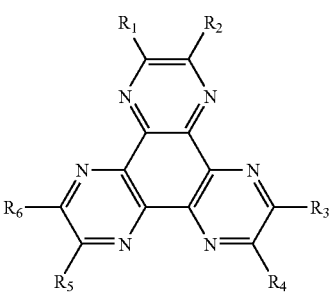

wherein $R_1$-$R_6$ are independently chosen from the group consisting of hydrogen, halo, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—CO—OR), amide (—CO—NHR or —CO—NRR'), straight-chain or branched (substituted or unsubstituted) $C_1$-$C_{12}$ alkoxy, straight-chain or branched (substituted or unsubstituted) $C_1$-$C_{12}$ alkyl, aromatic or non-aromatic (substituted or unsubstituted) heterocyclic, substituted or unsubstituted aryl, mono- or di-(substituted or unsubstituted)aryl-amine, (substituted or unsubstituted)alkyl-(substituted or unsubstituted)aryl-amine, and substituted or unsubstituted electron withdrawing substituent groups, where R and R' are independently selected from substituted or unsubstituted $C_1$-$C_{60}$ alkyl, substituted or unsubstituted aryl, substituted or unsubstituted 5-7 membered heterocyclic, where substituted $C_1$-$C_{60}$ alkyl, aryl and heterocyclic are optionally substituted with one or more of amine, amide, ether and ester groups, and where
aryl groups includes phenyl, biphenyl, terphenyl, naphthyl, anthracenyl, tetracenyl, pentacenyl, perylenyl and coronenyl, which are singly or multiply substituted or unsubstituted. A preferred material has the structure:

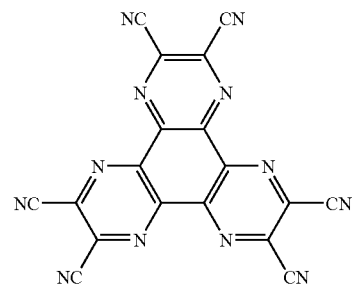

A second sublayer of the second organic layer includes a second organic emissive material. The first metal is in direct contact with the first sublayer of the second organic layer.

The intermediate connector may have a number of different configurations, so long as it includes the first and second metals with the described work functions, and the first metal is in contact with the first sublayer of the second organic layer. The intermediate connector may include a first layer consisting essentially of or comprising the first metal in direct contact with the first sublayer of the second organic layer, and a second layer consisting essentially of or comprising the second metal, the second layer being in direct contact with the first layer, and disposed closer to the anode than the first layer. The intermediate connector may optionally further include a third layer in contact with the second layer, the third layer being disposed closer to the anode than the second layer, the third layer consisting essentially of or comprising a metal halide or metal oxide. Preferred materials include LiF for the metal halide or metal oxide, Ca for the first metal and Al for the second metal. Where a layer "comprises" a material, additional materials may be present, for example a third metal. The intermediate connector may comprise a first layer comprising or consisting essentially of a mixture of the first and second metals, the first layer in direct contact with the first sublayer of the second organic layer. Any of the structure may be repeated one or more times. For example, the intermediate connector may comprise, in order, a first layer consisting essentially of the first metal, a second layer consisting essentially of the second metal, a third layer consisting essentially of a metal halide or metal oxide, a fourth layer consisting essentially of the first metal, a fifth layer consisting essentially of the second metal, and a sixth layer consisting essentially of a metal halide or metal oxide.

The first organic emissive material is preferably a fluorescent material, and the second organic emissive material is preferably a phosphorescent material. The first organic emissive material is a fluorescent material having a peak emissive wavelength in the visible spectrum that is less than 550 nm, and the second organic emissive material is preferably a phosphorescent emissive material having a peak emissive wavelength in the visible spectrum that is greater than 550 nm.

The device may emit light having a CRI greater than 89.
The intermediate connector is preferably non-addressable.

Preferably, sublayers of the first and second organic layers that are in contact with the intermediate connector are not conductivity doped.

Consumer products including the devices described herein are also provided.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
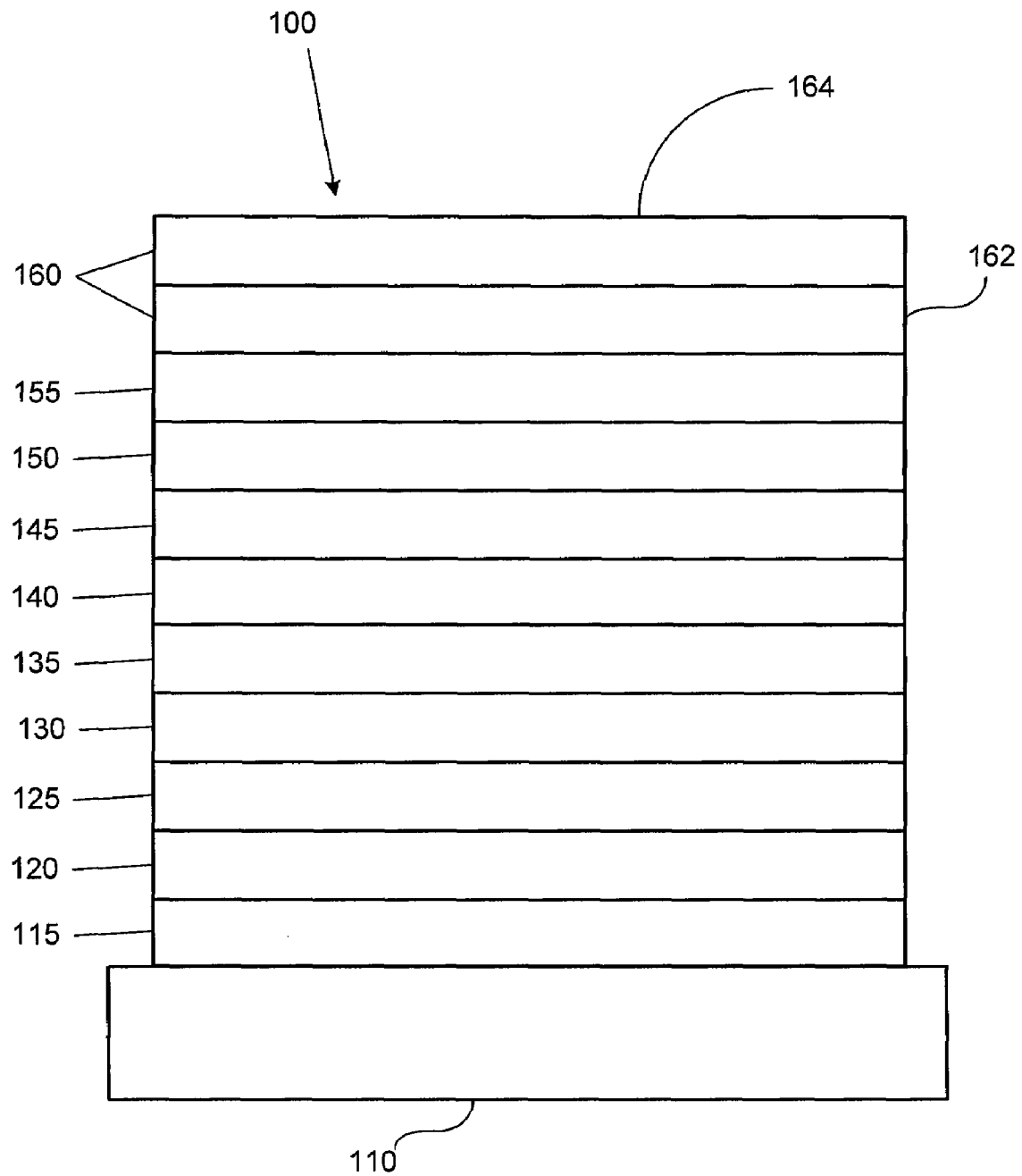
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
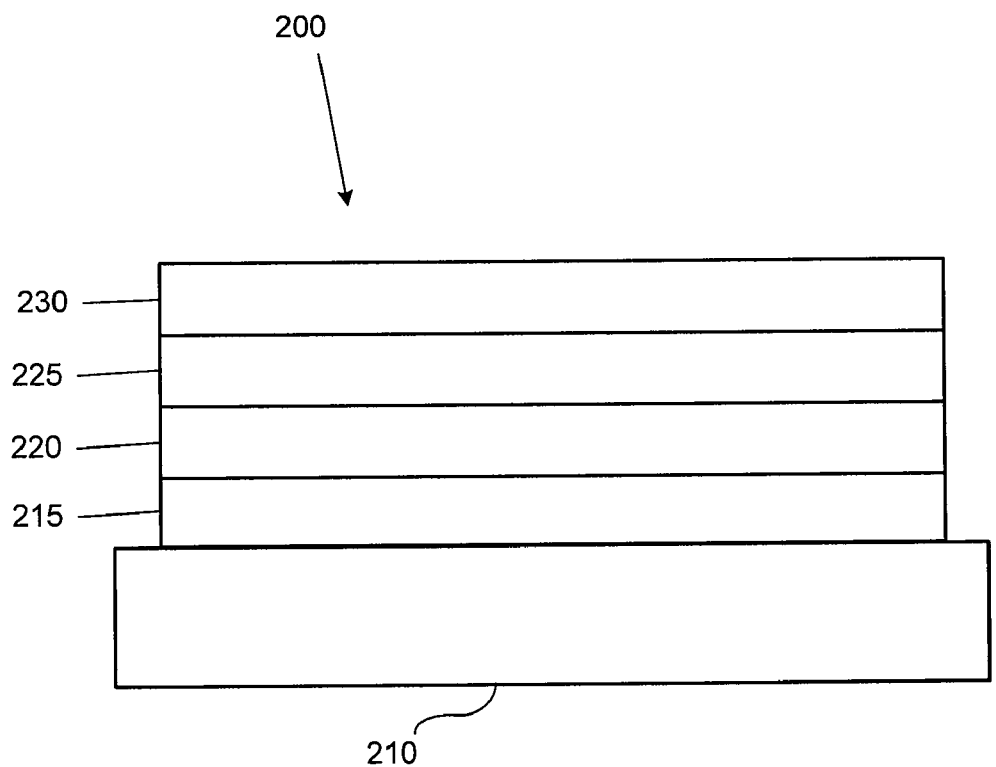
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
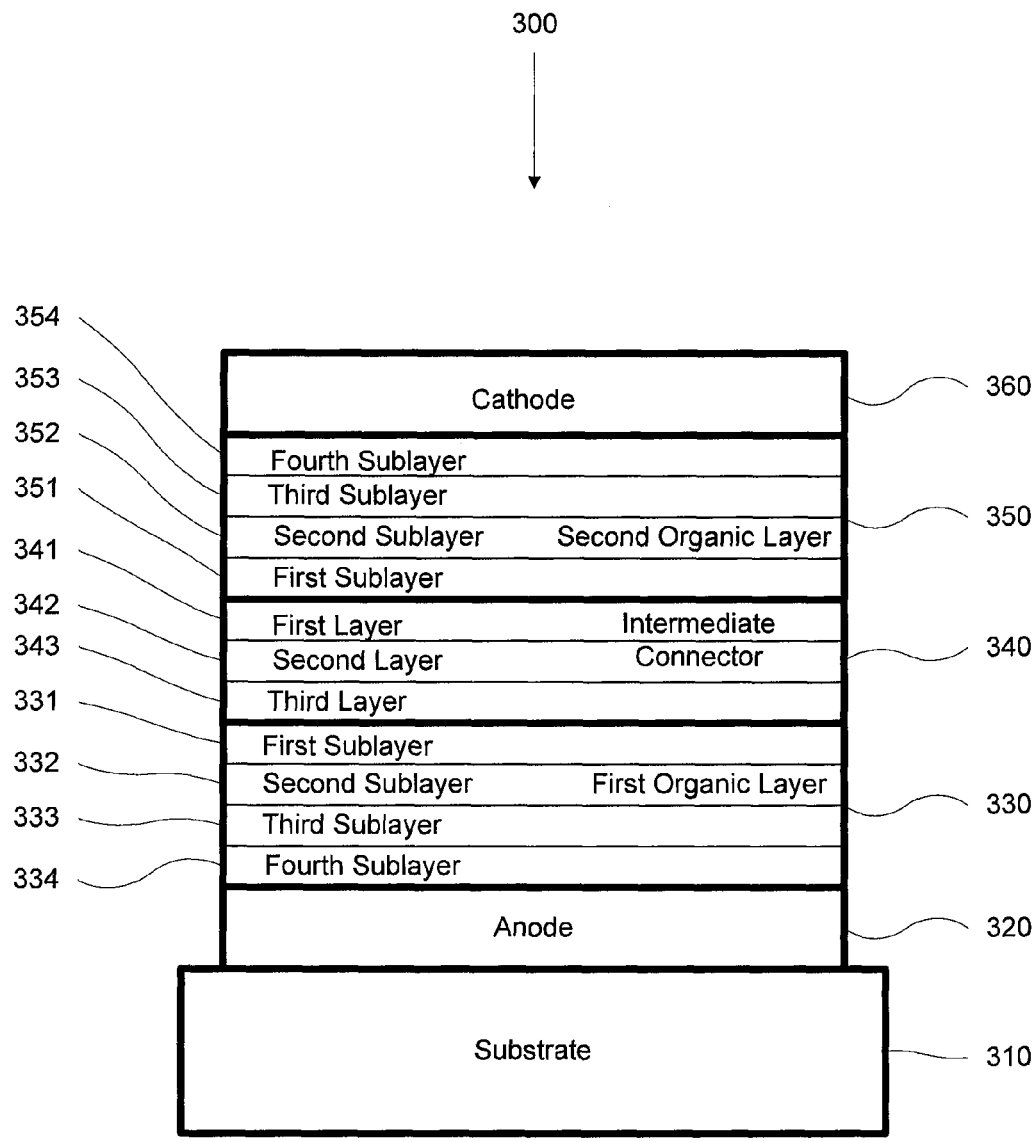
FIG. 3 shows a stacked organic light emitting device having an intermediate connector.

FIG. 3 shows a stacked organic light emitting device 300. Device 300 is disposed on a substrate 310, and includes an anode 320, a cathode 360, and an intermediate connector 340 disposed between anode 320 and cathode 360. A first organic layer 330 is disposed between anode 320 and intermediate connector 340. A second organic layer 350 is disposed between intermediate connector 340 and cathode 360.

Each of the layers of organic light emitting device 300 may have further substructure. For example, first organic layer 330 may further include first sublayer 331, second sublayer 332, third sublayer 333 and fourth sublayer 334. Similarly, second organic layer 340 may further include first sublayer 341, second sublayer 342, third sublayer 343 and fourth sublayer 344. First organic layer 330 and second organic layer 350 may include more or less sublayers than illustrated. The sublayers of first organic layer 330 and second organic layer 350 correspond to the various organic layers that may be present in an OLED, such as an emissive layer, transport layers, injection layers, and other layers, which are described in more detail with reference to FIGS. 1 and 2, Table 4, and elsewhere. Because the organic layers are intended to emit light, at least one of the sublayers of each of first organic layer 330 and second organic layer 340 includes an organic emissive material.

Similarly, although anode 320 and cathode 360 are not illustrated with further substructure, they may be any anode and cathode known to the art, which may include substructure. Substrate 310 may be located on either side of the device, i.e., adjacent to anode 320 or adjacent to cathode 360. The illustrated configuration, with substrate 310 adjacent to anode 320, is more common due to fabrication considerations.

As used herein, the term "intermediate connector" refers to a layer or plurality of layers that, for adjacent stacked devices, acts as an anode for one device and as a cathode for the other. An intermediate electrode is not necessarily connected to an external voltage or current source, but may still generate electrons and holes for injection into the adjacent organic layers. Intermediate connector 340 includes a first metal having a work function lower than 4.0 eV and a second metal having a work function lower than 5.0 eV. The work function of the first metal is at least 0.5 eV less than the work function of the second metal. The first metal is in direct contact with the first sublayer of the second organic layer.

In device 300, intermediate connector acts as an anode for organic layer 350 by injecting holes into sublayer 351, and as a cathode for organic layer 330 by injecting electrons into sublayer 331. It is generally desirable to use a metal having a work function higher than 4.2 eV as an anode to achieve efficient hole injection, and a metal having a work function lower than 4.4 eV as a cathode to achieve efficient electron injection. However, if these generally desirable parameters were used in the device illustrated in FIG. 3, using intermediate electrode 540 of FIG. 4 to illustrate the point, there would be an undesirable increase in the voltage needed to drive the device. This increase in drive voltage would be due to the difference in work functions at the interface between first layer 541 (using a high work function metal) and second layer 542 (using a low work function metal). Put another way, at an interface between two metals having different work functions, it is energetically favorable for electrons to move into the metal having a higher work function. While this effect may be reversed using drive voltage, it is undesirable to increase drive voltage.

The arrangement of metals described herein for use in intermediate connector 340, where the work function of the first metal is at least 0.5 eV less than the work function of the second metal, results in a situation where it is energetically favorable for electrons to move into the second metal, not the first metal, and for holes to correspondingly move into the first metal. This is desirable because the holes are then located in the first metal, which can then act as an anode by injecting the holes into first sublayer 351. A difference in the work functions of at least 0.5 eV, where the first metal has a work function at least 0.5 eV lower than that of the second metal, results in a significant effect.

Generally, a high work function metal is desired to achieve efficient hole injection into an adjacent organic material, and low work function metals are not generally well suited for injecting holes. Fortunately, this general consideration may be overcome by using organic materials that are particularly good at receiving holes injected from low work function metals, as described herein. In addition, the movement of holes into the first metal as described above also assists with making the first metal suited to injecting holes in the structures of devices disclosed herein.

Figure 4:
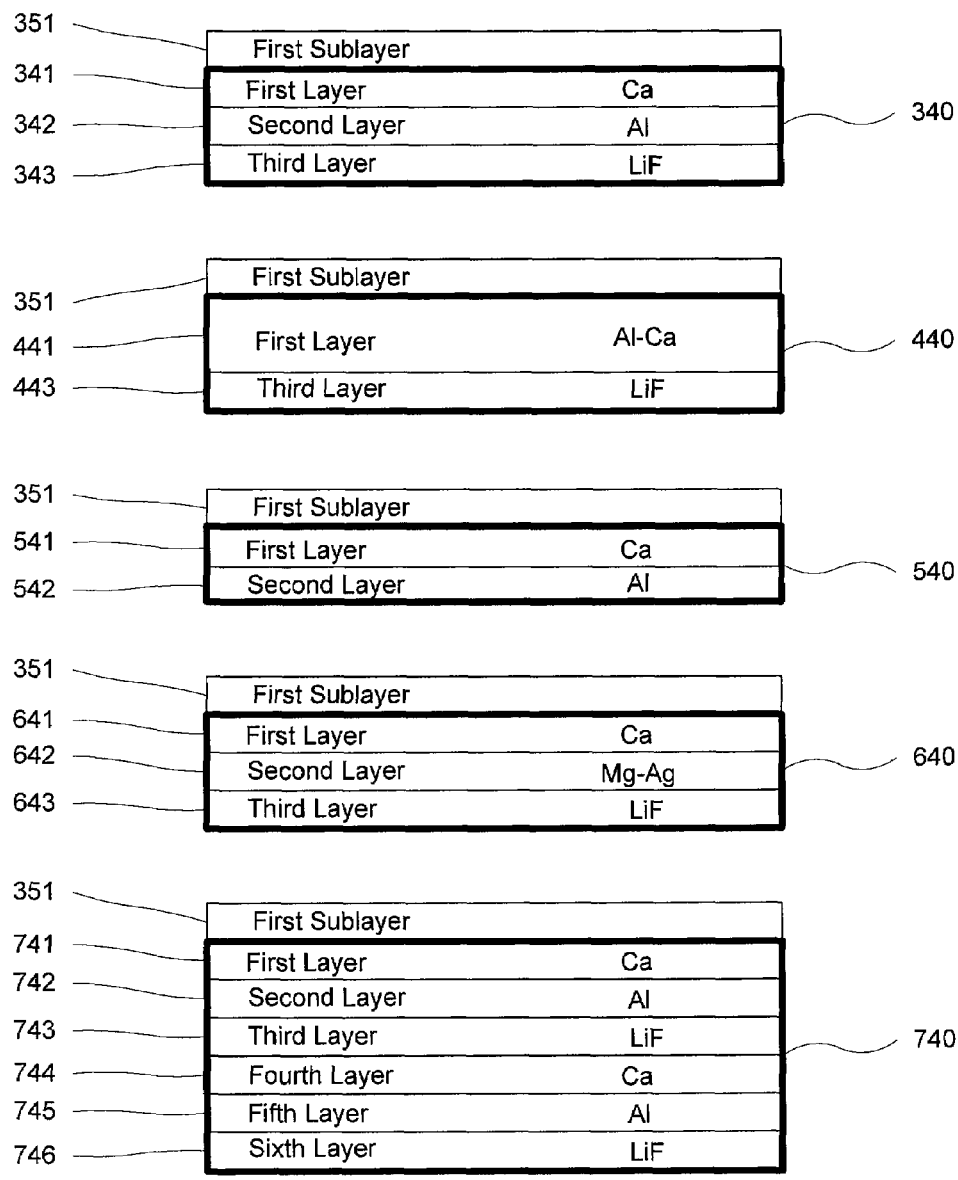
FIG. 4 shows a stacked organic light emitting device having an intermediate connector different from the intermediate connector of FIG. 3.

As illustrated in FIG. 3 and in intermediate connector 340 of FIG. 4, one way to implement the metals present in intermediate connector 340 is with separate layers. Intermediate connector includes a first layer 341, a second layer 342, and a third layer 343. First layer 341 consists essentially of the first metal. Second layer 342 consists essentially of the second metal. Third layer 343 consists essentially of another material, to illustrate that other materials may be present in intermediate connector 340.

It is desired that the first metal, which has a work function lower than 4.0 eV, be able to inject holes into second organic layer 350, such that the first metal can act as an anode. Conventional anode materials use high work function metals to achieve hole injection. Typically, a work function higher than 4.2 eV is considered desirable. However, the work function of the first metal is much lower. As a result, first sublayer 351 of second organic layer 350 comprises an organic material that is particularly well suited to accepting hole injection from a low work function anode. Suitable materials have the structure:

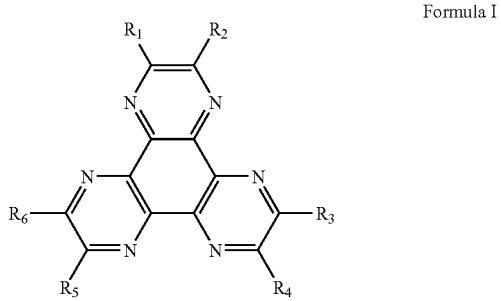

Formula I wherein $R_1$-$R_6$ are independently chosen from the group consisting of hydrogen, halo, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—CO—OR), amide (—CO—NHR or —CO—NRR'), straight-chain or branched (substituted or unsubstituted) C$_1$-C$_{12}$ alkoxy, straight-chain or branched (substituted or unsubstituted) C$_1$-C$_{12}$ alkyl, aromatic or non-aromatic (substituted or unsubstituted) heterocyclic, substituted or unsubstituted aryl, mono- or di-(substituted or unsubstituted)aryl-amine, and (substituted or unsubstituted)alkyl-(substituted or unsubstituted)aryl-amine. In the foregoing substituent groups, R and R' are, for example, substituted or unsubstituted C$_1$-C$_{60}$ alkyl, substituted or unsubstituted aryl, substituted or unsubstituted 5-7 membered heterocyclic. The substituted C$_1$-C$_{60}$ alkyl, aryl and heterocyclic are optionally substituted with one or more of amine, amide, ether and ester groups. Alternatively, $R_1$-$R_6$ are independently selected from substituted or unsubstituted electron withdrawing substituent groups, which are well understood by those of ordinary skill in the art. The aryl group includes phenyl, biphenyl, terphenyl, naphthyl, anthracenyl, tetracenyl, pentacenyl, perylenyl and coronenyl, which are singly or multiply substituted or unsubstituted. Such materials are described in further detail in U.S. Patent Publication 2004/0113547, which is incorporated by reference in its entirety, and particularly at paragraphs 34-41 and claim 1 which describe the class of materials. For purposes of this application, the definitions in this paragraph, which are drawn from U.S. Patent Publication 2004/0113547, take priority over any inconsistent definition elsewhere in this application only for purposes of describing materials having Formula I. A preferred organic material for use in first sublayer 351 has the structure:

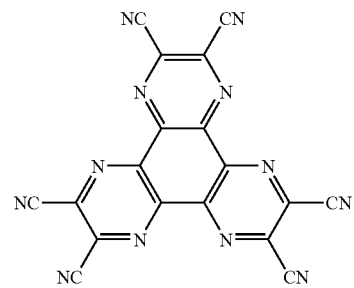

This material is available for purchase from LG Chemicals of Korea, and is known as LG101.

Without being limited to any theory as to why certain features work, a low work function anode may be able to efficiently inject holes into certain organic materials. For organic materials with conductivities greater than 10$^{-6}$ S/cm, the band bending of the organic material at the interface between it and a metal (or degenerate semiconductor) contact can enable formation of an ohmic contact between the organic material and the contact. Organic materials can be doped with acceptor or donor materials to achieve conductivities >10$^{-6}$ S/cm; however, there are organic materials, e.g. LG101, that may have such high conductivity without the use of dopants. The band bending enabled by the conductive organic material allows tunneling of carriers between the organic material and the contact. In the case of Ca and LG101, holes from Ca may tunnel into LG101 and be transported towards the cathode. See, K. Walzer, B. Maennig, M. Pfeiffer and K. Leo. Chem. Rev. 107, 1233-1271 (2007).

Intermediate connector 340 of FIG. 4 has the same structure as intermediate connector 340 of FIG. 3. FIG. 4 also provides examples of materials that may be used in the various layers. In intermediate connector 340 of FIG. 4, Ca is the first metal and Al is the second metal. Intermediate connector 340 also includes a third layer 343 in direct contact with first sublayer 331 of first organic material 330. In the configuration illustrated in connector 340 of FIG. 4, third layer 343 consists essentially of LiF. More generally, metal halides and metal oxides may be useful for assisting with the injection of electrons into an organic layer such as first sublayer 331. CsF and NaF are examples of known alternatives for LiF, and other materials may be used as well. The use of a layer of metal oxide or metal halide in direct contact with first sublayer 331 of first organic material 330 is generally preferred, but not necessary. Materials such as LiF may be effective in small amounts, and may also diffuse significantly. Thus, "layer" 343 may not be a complete discrete layer, but may rather be islands or the like.

Intermediate connector 340 may be non-addressable. As used herein, the term "non-addressable," with reference to an intermediate connector, means that the connector is not directly attached to a voltage source or to ground. Rather, the intermediate connector is in direct electrical contact only with the organic layers of a device or stack of devices. A non-addressable intermediate connector does not necessarily need to have good lateral conductivity, and may be much thinner than an electrode that needs excellent conduction in lateral directions.

The specific arrangement illustrated in intermediate connector 340 is preferred due to simplicity of fabrication. The specific materials shown in intermediate connector 340 are preferred because surprising results have been shown for these materials, although it is believed that the results may be extended to other configurations and material combinations.

FIG. 4 also shows a variety of other intermediate connectors, i.e., intermediate connectors 440, 540, 640 and 740, any of which may be used in place of intermediate connector 340 of FIG. 3. A wide variety of materials and configurations may be used to achieve the desired requirements of first and second metals with the work functions described, where the first metal is in contact with first sublayer 351 of second organic layer 350. FIG. 4. provides a non-exhaustive list of examples. While only first sublayer 351 is illustrated in FIG. 4 in addition to the intermediate connectors, it is understood that the intermediate connectors may be incorporated into devices having structures similar to those shown in FIG. 3 as well as variations from those devices.

Intermediate connector 440 of FIG. 4 shows that the first and second metals may be mixed in a first layer 441. The example metals illustrated are Ca as the first metal and Al as the second metal. The first metal is in contact with first sublayer 351 of second organic layer 350 because first layer 441 of intermediate electrode is in contact with that layer, and first layer 441 comprises the first metal in addition to other materials, in this case the second metal.

Intermediate connector 540 of FIG. 4 shows that a simple bilayer of the first and second metals may be used. The example metals illustrated are Ca as the first metal and Al as the second metal. The first metal is in contact with first sublayer 351 of second organic layer 350 because first layer 541 of intermediate electrode is in contact with that layer, and first layer 541 consists essentially of the first metal. While it may be more desirable in some instances to use an additional layer on the side of the intermediate connector that is in contact with first organic layer 330 to assist with electron injection, such as third layer 343 illustrated in intermediate connector 340, this additional layer is generally optional as illustrated in intermediate connector 350.

Intermediate connector 640 of FIG. 4 shows that other materials may be mixed with the first and second metals. The example metals illustrated are Ca as the first metal and Ag or Mg as the second metal—either of Mg or Ag qualify as the second metal because both have a work function less than 5.0 eV, and both have a work function at least 0.5 eV greater than that of Ca. The first metal is in contact with first sublayer 351 of second organic layer 350 because first layer 641 of intermediate electrode is in contact with that layer, and first layer 641 consists essentially of the first metal.

Intermediate connector 740 of FIG. 4 shows that the intermediate connector may have many layers. The example metals illustrated are Ca as the first metal and Al as the second metal. The first metal is in contact with first sublayer 351 of second organic layer 350 because first layer 741 of intermediate electrode is in contact with that layer, and first layer 741 consists essentially of the first metal.

Preferably, each metal layer in an intermediate connector has a thickness less than 8 nm. A thickness of 0.5-2 nm is preferred. This thickness is sufficient to achieve the desired electrical effect. Higher thicknesses may result in unwanted high lateral conductivity and optical effects, i.e., increased reflection and/or absorption of light, without a benefit sufficient to justify the optical effect. Preferably, the total thickness of the intermediate connector is less than 8 nm for similar reasons.

As used herein, the terms "comprise" and "consist essentially of" are used as generally understood by patent practitioners. If an element is described or claimed as "comprising" a particular part or material, the claim element may also include other parts or materials. If an element is described or claimed as "consisting essentially of" a particular part or material, the claim element generally includes only that part or material, although some small deviation or impurity is allowed so long as the general properties are not significantly affected. Specifically, a layer that "comprises" a particular material may also include other materials. A layer that "consists essentially of" a particular material does not include other materials to the extent that they significantly affect the properties, although a typical level of impurities or the like is allowed. For example, for first layer 341 of intermediate connector 340, if the layer "comprises" the first metal, any amount of other materials may also be present. If first layer 341 "consists essentially of" the first metals, any other materials, such as the second metal, should either not be present, or should be present in an amount less than 10 wt %. It is believed that amounts less than about 10 wt % will not significantly affect the injection of holes from first layer 341 into first sublayer 351.

Any combination of metals that meets the work function requirements described herein may be used for the first and second metals. For the reader's convenience, information available in the CRC Handbook on Chemistry and Physics is reproduced herein, where units are in eV.

TABLE 1

| Work functions of selected materials | | | | | | | | | | | |
| --- | --- | --- | --- | --- | --- | --- | --- | --- | --- | --- | --- |
| Element | eV | Element | eV | Element | eV | Element | eV | Element | eV | Element | eV |
| Ag | 4.26 | Al | 4.28 | As | 3.75 | Au | 5.1 | B | 4.45 | Ba | 2.7 |
| Be | 4.98 | Bi | 4.22 | C | 5 | Ca | 2.87 | Cd | 4.22 | Ce | 2.9 |
| Co | 5 | Cr | 4.5 | Cs | 2.14 | Cu | 4.65 | Eu | 2.5 | Fe | 4.5 |
| Ga | 4.2 | Gd | 3.1 | Hf | 3.9 | Hg | 4.49 | In | 4.12 | Ir | 5.27 |
| K | 2.3 | La | 3.5 | Li | 2.9 | Lu | 3.3 | Mg | 3.66 | Mn | 4.1 |
| Mo | 4.6 | Na | 2.75 | Nb | 4.3 | Nd | 3.2 | Ni | 5.15 | Os | 4.83 |
| Pb | 4.25 | Pt | 5.65 | Rb | 2.16 | Re | 4.96 | Rh | 4.98 | Ru | 4.71 |
| Sb | 4.55 | Se | 3.5 | Se | 5.9 | Si | 4.85 | Sm | 2.7 | Sn | 4.42 |

TABLE 1-continued

Work functions of selected materials

| Element | eV | Element | eV | Element | eV | Element | eV | Element | eV | Element | eV |
|---|---|---|---|---|---|---|---|---|---|---|---|
| Sr | 2.59 | Ta | 4.25 | Tb | 3 | Te | 4.95 | Th | 3.4 | Ti | 4.33 |
| Tl | 3.84 | U | 3.63 | V | 4.3 | W | 4.55 | Y | 3.1 | Zn | 4.33 |
| Zr | 4.05 | | | | | | | | | | |

With reference to Table 1, it can be seen that Ca is a desirable first metal due to its low work function. Many common metals used as electrodes in OLEDs can be used as a second metal in connection with Ca, because they have work functions lower than 5.0 eV that are also at least 0.5 eV greater than the 2.87 eV work function of Ca. Examples of metals suitable for use as a second metal where Ca is the first metal include Ag, Al, Mg and Zn. Other desirable combinations include the use of Mg as the first metal, in conjunction with Ag, Al, or Zn as the second metal. Other combinations are also possible, using materials in Table 1 as well as other materials.

One desirable application for stacked devices is the emission of white light. A stacked OLED may emit from multiple materials, achieving the broad overall spectrum needed for white light. A preferred way to stack the devices is to include a lower wavelength emitting fluorescent material in first organic layer 330, and a higher wavelength emitting phosphorescent material (or materials) in second organic layer 350, where the viewer is located on the substrate side of the device. For example, "lower wavelength" may mean less than about 550 nm, and "higher wavelength" may mean greater than about 550 nm. White light has components across the visible spectrum. A fluorescent material is preferred for the higher wavelength components, such as blue light, because blue phosphorescent materials, while potentially much more efficient than fluorescent materials, may not yet have the reliability or lifetimes desired for commercial applications. A phosphorescent material or materials is preferred for higher wavelength emission because higher efficiency is available with phosphorescent materials, and at higher wavelengths, the reliability and lifetimes needed for commercial applications are available. The arrangement of the materials described is preferred because it is desirable that the lower wavelength emitting material be closer to the viewer than the materials that emit higher wavelengths. This is because emissive materials generally absorb strongly in for wavelengths in a range somewhat lower than the emissive wavelengths. Thus, a blue emitting material is unlikely to absorb much red, yellow, or other higher wavelength light, whereas a red, yellow, or other higher wavelength emitting material may absorb significant amounts of blue light.

A CRI greater than 89 has been demonstrated. High CRI is desirable for lighting applications.

It is preferred that the organic layers that are in direct contact with intermediate connector 340, i.e., first sublayer 331 and first sublayer 351, are not conductivity doped. As used herein, "conductivity doped" means that a dopant results in at increase in conductivity by a factor of at least 100. Organic conductivity dopants may have high lateral conductivity, are not easily amenable to manufacturing and may adversely affect operational stability. High lateral conductivity may cause unwanted leakage currents that reduce the efficiency of devices. Organic n-type dopants are especially reactive to air, so they are difficult to handle and require special tools that are not used with typical organic materials. Some organic conductivity dopants are mobile especially at elevated temperatures above room temperature. This material mobility may adversely affect the lifetime of devices.

EXPERIMENTAL

Materials used in fabricating devices described herein have the following structures:

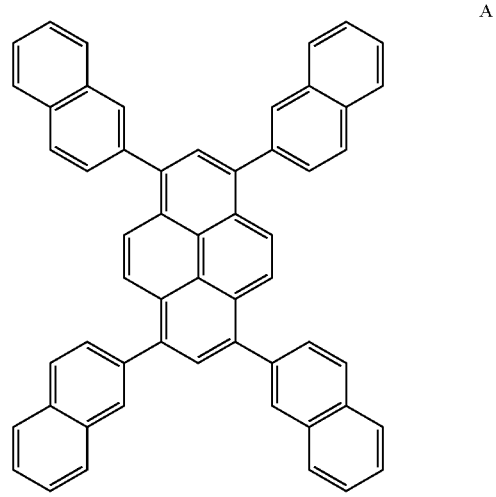

A

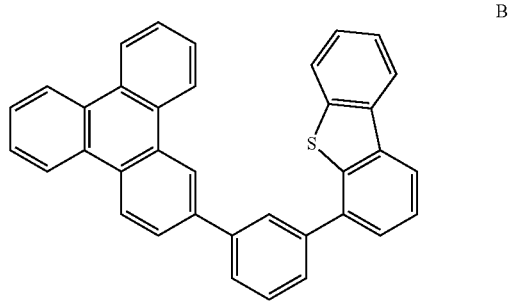

B

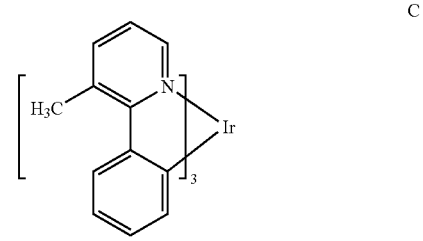

C

-continued

D
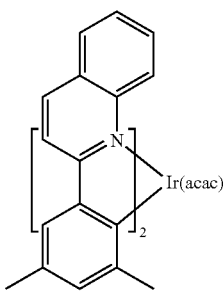

E
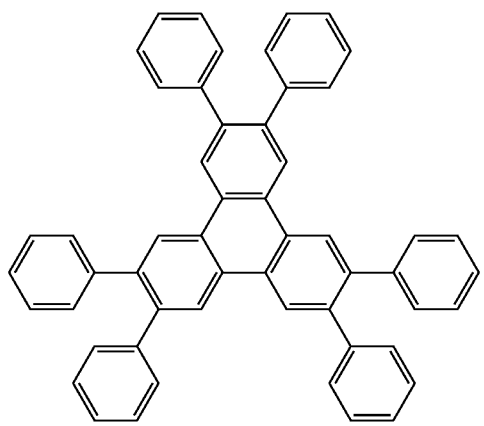

Naphthylphenylbiphenyl diamine (α-NPD or NPD), Bis(2-methyl-8-hydroxyquinolinolato)(4-phenylphenolato) aluminum (BAlq), and 9,10-Di(naphth-2-yl)anthracene (ADN) are well known materials.

Devices were grown using standard fabrication techniques. The devices had the structures shown in Table 2. All devices had a 120 nm thick ITO anode, followed by a 10 nm thick layer of LG101, followed by a 30 nm thick layer of NPD, followed by the layers described in Table 2.

Table 3 shows measured performance for the devices having the structures shown in Table 2.

TABLE 3

| | Measured Device Performance | | | | | | | |
|---|---|---|---|---|---|---|---|---|
| Dev # | V | cd/A (@4,000 nits) | EQE | PE | CIE x | CIE y (@10 mA/cm²) | CRI | CCT |
| 1 | 5.8 | 3.5 | 2.3 | 1.9 | 0.152 | 0.205 | — | — |
| 2 | 10.4 | 38.9 | 16.2 | 11.7 | 0.401 | 0.459 | 89 | 4000 K |
| 3 | 10.8 | 35.2 | 13.9 | 10.2 | 0.452 | 0.518 | — | — |
| 4 | 10.6 | 36.6 | 16.0 | 10.8 | 0.476 | 0.451 | 90 | 2800 K |
| 5 | 10.9 | 33.8 | 15.0 | 9.7 | 0.472 | 0.447 | 91 | 2800 K |

Devices 1, 2 and 3 were all grown on the same substrate. Device 1 organic layers are identical to the organic layers in the bottom blue OLEDs of the SOLEDs described as Devices 2 and 3. Blue emission is absent from Device 3 because Ca was not incorporated in the junction that connects the bottom and top OLEDs, so the blue OLED does not emit. Therefore, the EQE and cd/A for Device 2 is the sum of the EQE and cd/A of Device 1 plus Device 3. When all 3 emitters produce emission in Device 3, white emission with high color quality is obtained. Device 2 has a CRI of 89 at a warm CCT=4,000 K. The 38.9 cd/A at 4,000 nits is also remarkably high for this structure.

WOLEDs are seemingly best suited for warm white color emission because green and red OLEDs have the best efficiencies and longest lifetimes compared to blue OLEDs, and warm white colors consist of >=60% emission above 550 nm.

Device 4 shows how the device can be optimized to obtain a CRI=90 at CCT=2800K. This is a very high CRI.

Device 5 is another optimized device that uses blocking layer in the blue bottom fluorescent OLED. This device has the highest CRI=91 at a warm CCT=2800 K.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials

TABLE 2

| Dev # | Device Structure | | | | | | | | | |
|---|---|---|---|---|---|---|---|---|---|---|
| 1 | ADN: A 9% 20 nm | | LG201 30 nm | | | | | | | LiF/Al 100 nm |
| 2 | ADN: A 9% 20 nm | | LG201 30 nm | LiF(1 nm)/ Al(1 nm)/ Ca(1 nm) | LG101 20 nm | NPD 30 nm | B:C(10%):D(0.25%) 30 nm | E 5 nm | LG201 35 nm | LiF/Al 100 nm |
| 3 | ADN: A 9% 20 nm | | LG201 30 nm | LiF(1 nm)/ Al(1 nm) | LG101 20 nm | NPD 30 nm | B:C(10%):D(0.25%) 30 nm | E 5 nm | LG201 35 nm | LiF/Al 100 nm |
| 4 | ADN: A 10% 20 nm | | LG201 30 nm | LiF(1 nm)/ Al(1 nm)/ Ca(1 nm) | LG101 50 nm | NPD 30 nm | B:C(10%):D(0.5%) 25 nm | E 5 nm | LG201 35 nm | LiF/Al 100 nm |
| 5 | ADN: A 10% 30 nm | BAlq 5 nm | LG201 30 nm | LiF(1 nm)/ Al(1 nm)/ Ca(1 nm) | LG101 40 nm | NPD 30 nm | B:C(20%) D(0.3%) 25 nm | E 5 nm | LG201 35 nm | LiF/Al 100 nm | that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exciton/hole blocking layer materials, electron transporting and electron injecting materials may be used in an OLED. Non-limiting examples of the materials that may be used in an OLED in combination with materials disclosed herein are listed in Table 4 below. Table 4 lists non-limiting classes of materials, non-limiting examples of compounds for each class, and references that disclose the materials.

| MATERIAL | EXAMPLES OF MATERIAL | PUBLICATIONS |
|---|---|---|
| Hole injection materials | | |
| Phthalocyanine and porphryin compounds | 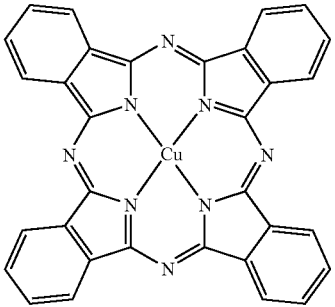 | Appl. Phys. Lett. 69, 2160 (1996) |
| Starburst triarylamines | 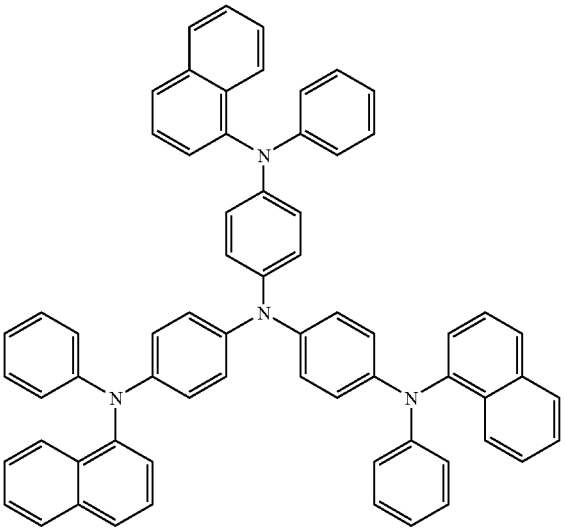 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polypthiophene) | 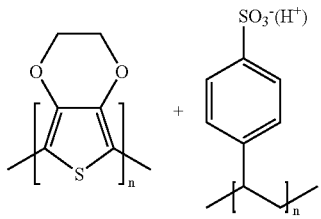 | Synth. Met. 87, 171 (1997) |
| Arylamines complexed with metal oxides such as molybdenum and tungsten oxides | 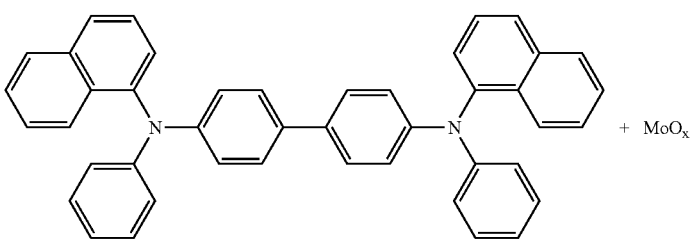 [SMILES: c1ccc(N(c2ccc(-c3ccc(N(c4ccccc4)c4cccc5ccccc45)cc3)cc2)c2cccc3ccccc23)cc1] + $MoO_x$ | SID Symposium Digest, 37, 923 (2006) |

| MATERIAL | EXAMPLES OF MATERIAL | PUBLICATIONS |
|---|---|---|
| Hole transporting materials | | |
| Triarylamines (e.g.,TPD, α-NPD) | 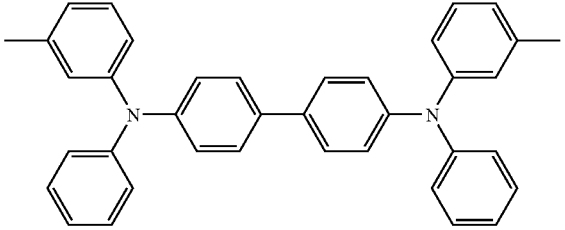 | Appl. Phys. Lett. 51, 913 (1987) |
| | 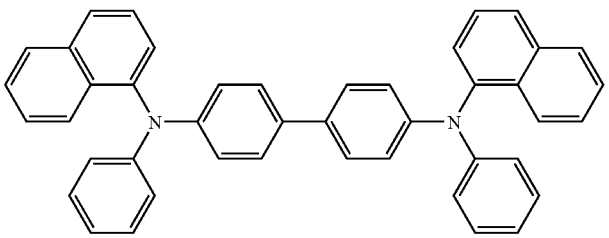 [SMILES: c1ccc(N(c2ccc(-c3ccc(N(c4ccccc4)c4cccc5ccccc45)cc3)cc2)c2cccc3ccccc23)cc1] | US5061569 |
| | 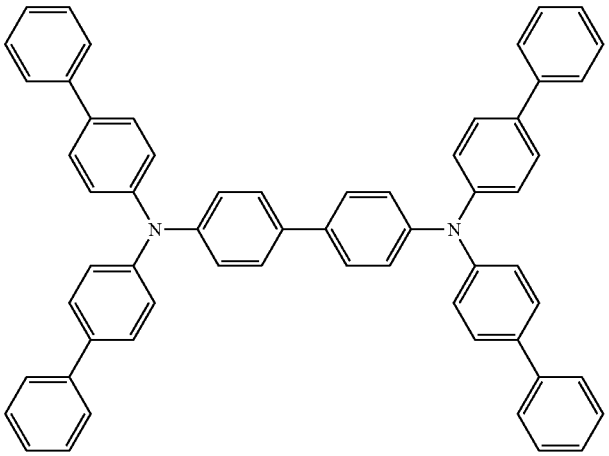 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 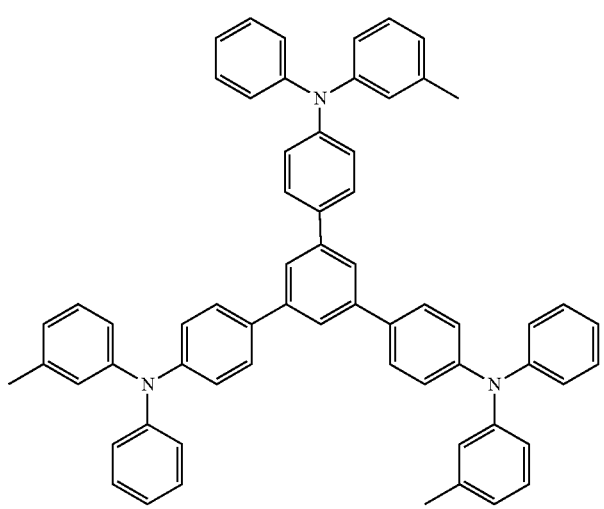 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

| MATERIAL | EXAMPLES OF MATERIAL | PUBLICATIONS |
|---|---|---|
| | 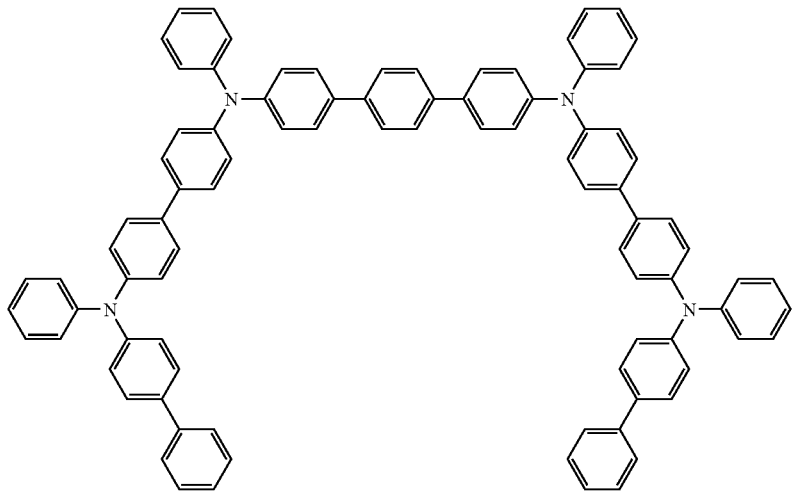 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 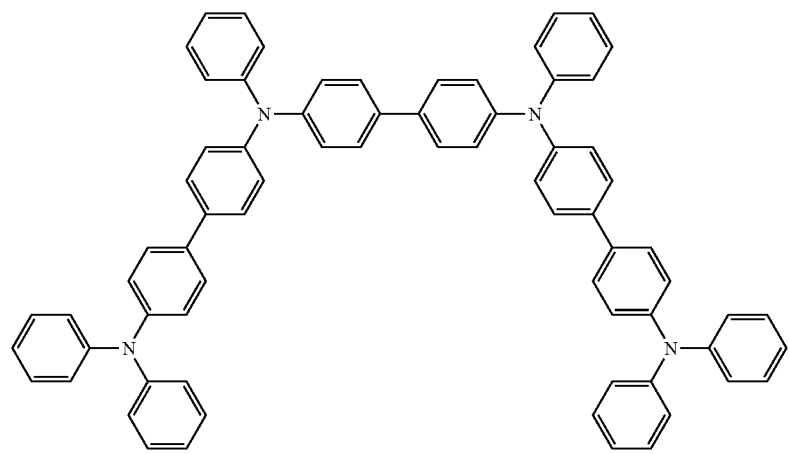 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triaylamine on spirofluorene core | 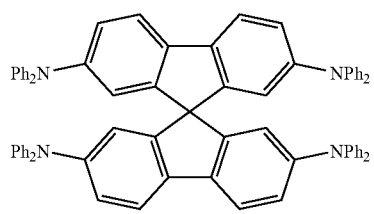 | Synth. Met. 91, 209 (1997) |

-continued
| MATERIAL | EXAMPLES OF MATERIAL | PUBLICATIONS |
|---|---|---|
| Arylamine carbazole compounds | 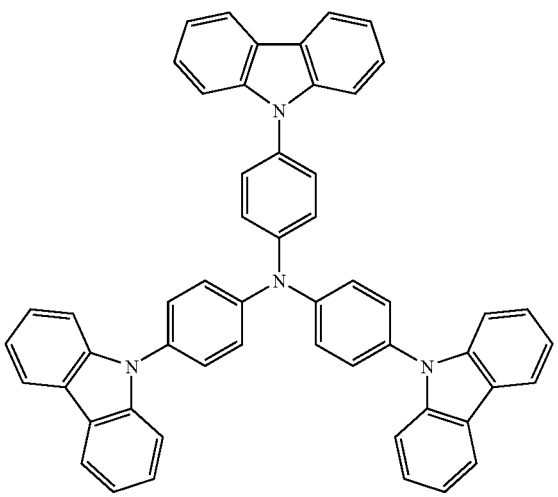 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994) |
| Indolocarbazoles | 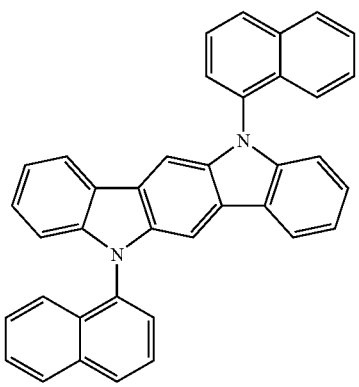 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 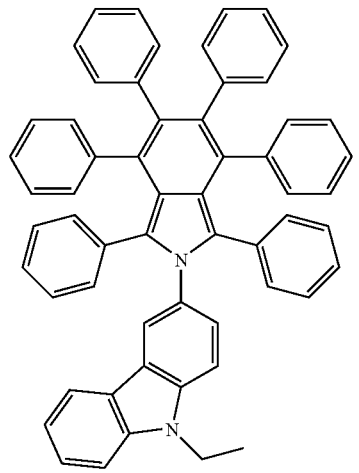 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
Phosphorescent OLED host materials -continued
| MATERIAL | EXAMPLES OF MATERIAL | PUBLICATIONS |
|---|---|---|
| Red hosts | | |
| Arylcarbazoles | 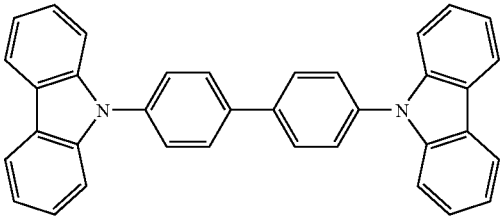 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., Alq$_3$, BAlq) | 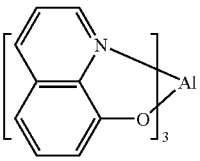 | Nature 395, 151 (1998) |
| | 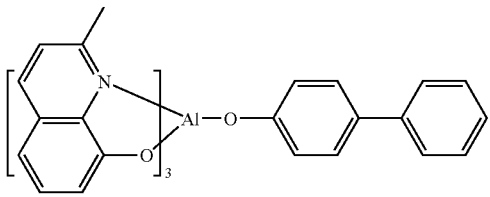 | US20060202194 |
| | 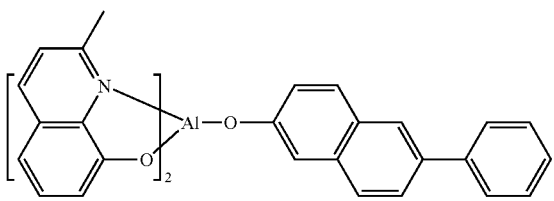 | WO2005014551 |
| Metal phenoxybenzothiazole compounds | 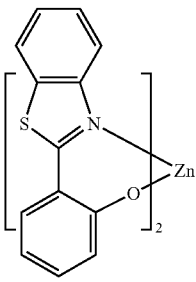 | Appl. Phys. Lett. 90, 123509 (2007) |
| Conjugated oligomers and polymers (e.g., polyfluorene) | 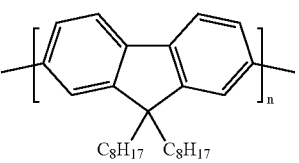 | Org. Electron. 1, 15 (2000) |
| Green hosts | | |
| Arylcarbazoles | 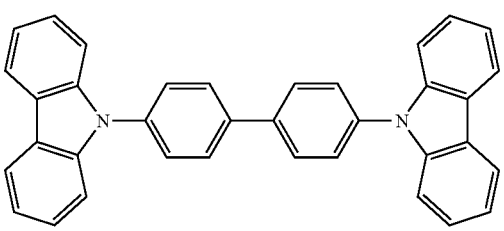 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |

| MATERIAL | EXAMPLES OF MATERIAL | PUBLICATIONS |
|---|---|---|
| | 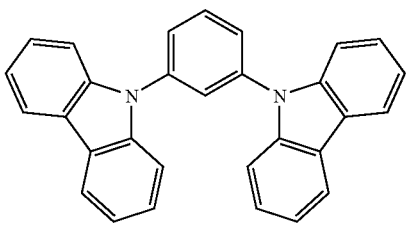 [SMILES: c1cc(-n2c3ccccc3c3ccccc32)cc(-n2c3ccccc3c3ccccc32)c1] | US2003175553 |
| | 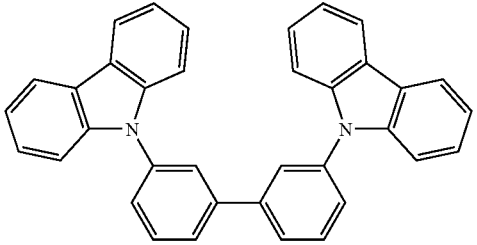 [SMILES: c1cc(-c2cccc(-n3c4ccccc4c4ccccc43)c2)cc(-n2c3ccccc3c3ccccc32)c1] | WO2001039234 |
| Aryltriphenylene compounds | 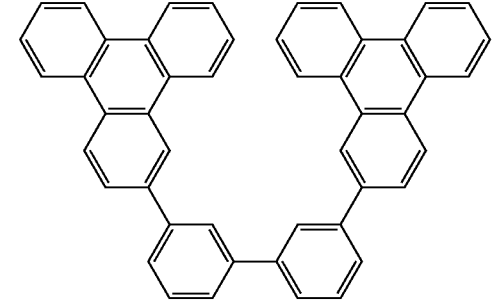 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 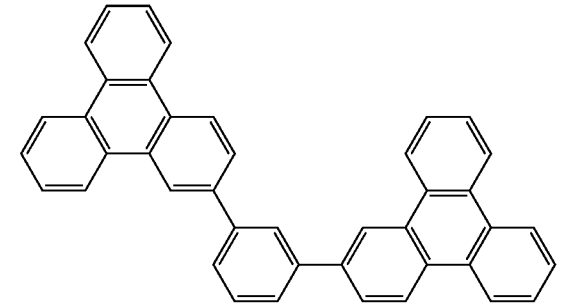 [SMILES: c1cc(-c2ccc3c4ccccc4c4ccccc4c3c2)cc(-c2ccc3c4ccccc4c4ccccc4c3c2)c1] | US20060280965 |
| Polymers (e.g., PVK) | 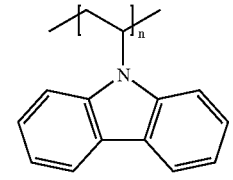 | Appl. Phys. Lett. 77, 2280 (2000) |
| Spirofluorene compounds | 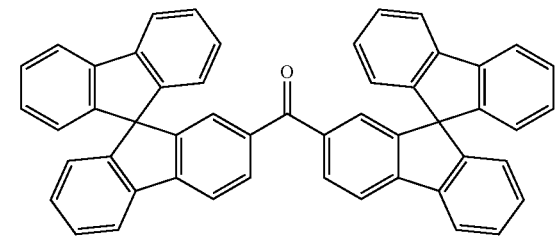 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

| MATERIAL | EXAMPLES OF MATERIAL | PUBLICATIONS |
|---|---|---|
| Metal phenoxybenzooxazole compounds | 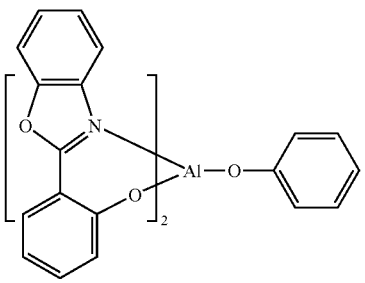 | WO05089025 |
| | 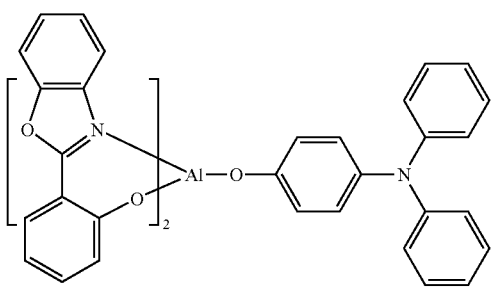 | WO06132173 |
| | 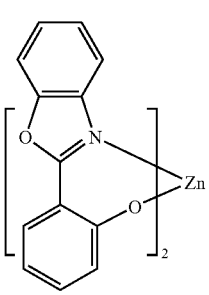 | JP200511610 |
| Spirofluorene-carbazole compounds | 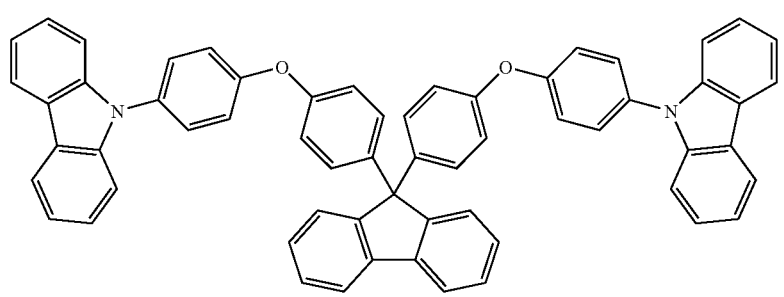 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 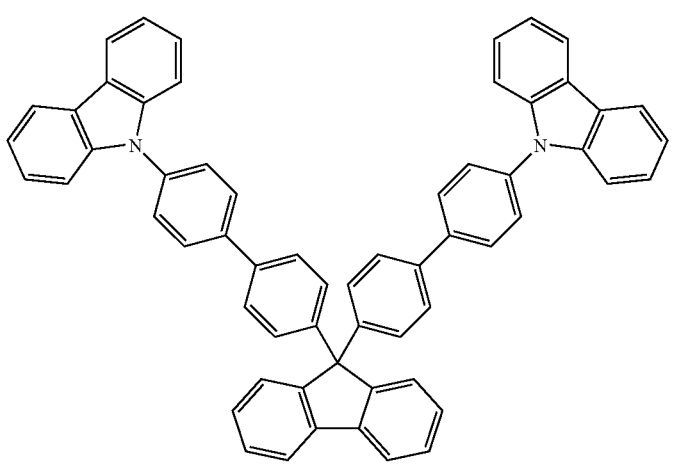 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |

| MATERIAL | EXAMPLES OF MATERIAL | PUBLICATIONS |
|---|---|---|
| Indolocabazoles | 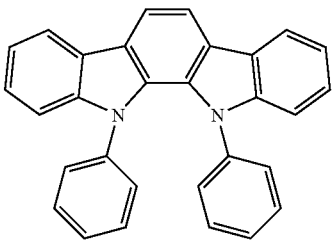 [SMILES: c1ccc(-n2c3ccccc3c3ccc4c5ccccc5n(-c5ccccc5)c4c32)cc1] | WO07063796 |
| | 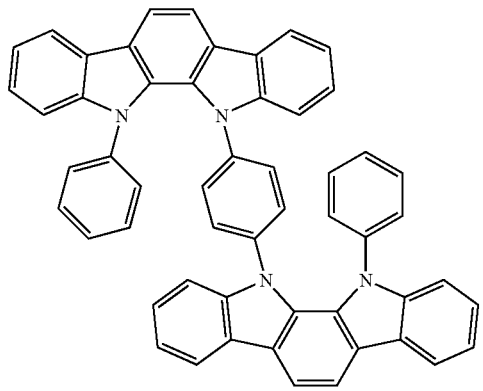 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO07063754 |
| 5-member ring electron deficient heterocycles (e.g., triazole, oxadiazole) | 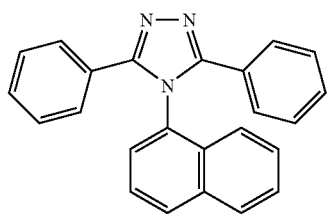 [SMILES: c1ccc(-c2nnc(-c3ccccc3)n2-c2cccc3ccccc23)cc1] | J. Appl. Phys. 90, 5048 (2001) |
| | 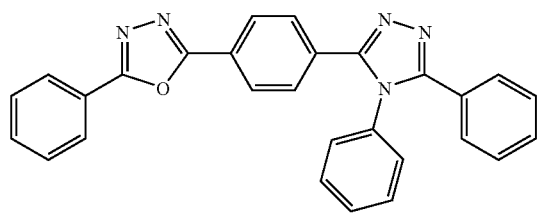 [SMILES: c1ccc(-c2nnc(-c3ccc(-c4nnc(-c5ccccc5)n4-c4ccccc4)cc3)o2)cc1] | WO04107822 |
| Metal phenoxypyridine compounds | 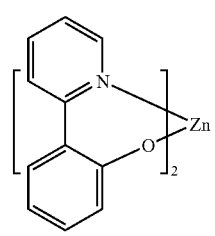 | WO05030900 |
Blue hosts
| | | |
|---|---|---|
| Arylcarbazoles | 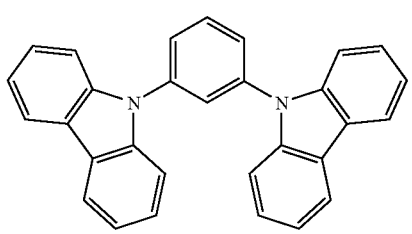 [SMILES: c1cc(-n2c3ccccc3c3ccccc32)cc(-n2c3ccccc3c3ccccc32)c1] | Appl. Phys. Lett, 82, 2422 (2003) |

-continued
| MATERIAL | EXAMPLES OF MATERIAL | PUBLICATIONS |
|---|---|---|
| | 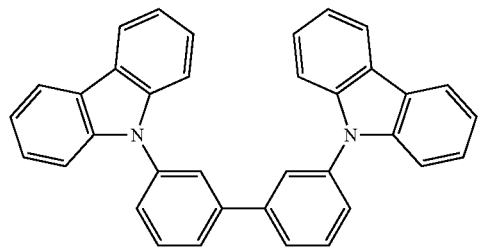 [SMILES: c1cc(-c2cccc(-n3c4ccccc4c4ccccc43)c2)cc(-n2c3ccccc3c3ccccc32)c1] | US20070190359 |
| Dibenzothiophene-carbazole compounds | 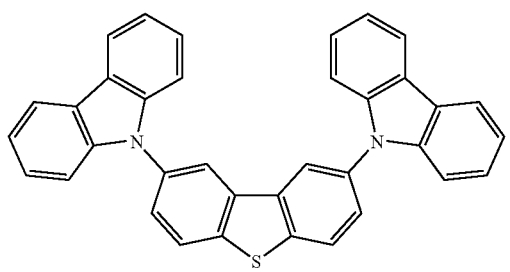 [SMILES: c1ccc2c(c1)c1ccccc1n2-c1ccc2sc3ccc(-n4c5ccccc5c5ccccc54)cc3c2c1] | WO2006114966 |
Phosphorescent dopants
Red dopants
| | | |
|---|---|---|
| Heavy metal porphyrins (e.g., PtOEP) | 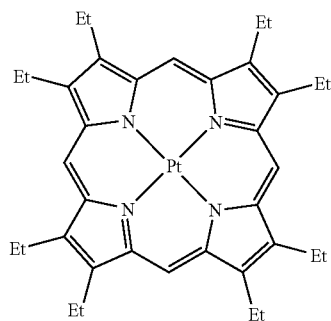 | Nature 395, 151 (1998) |
| Iridium(III) organometallic complexes | 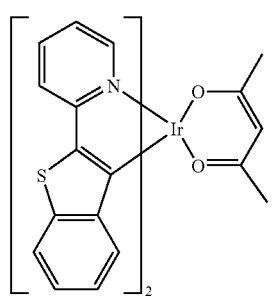 | Appl. Phys. Lett. 78, 1622 (2001) |
| | 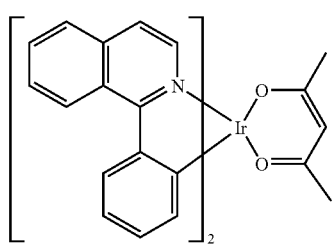 | US06835469 |

| MATERIAL | EXAMPLES OF MATERIAL | PUBLICATIONS |
|---|---|---|
| | 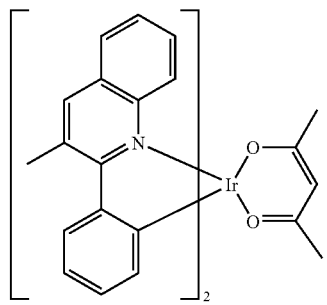 | US06835469 |
| | 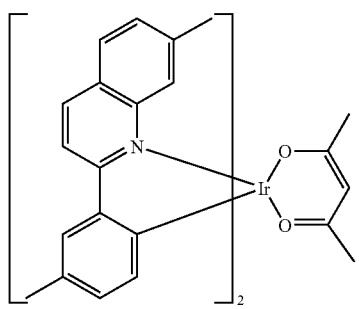 | US20060202194 |
| | 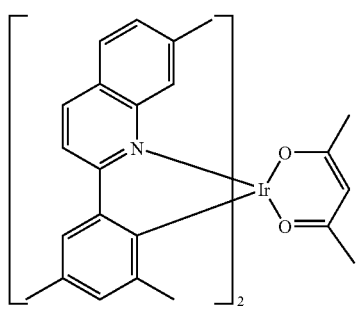 | US20060202194 |
| | 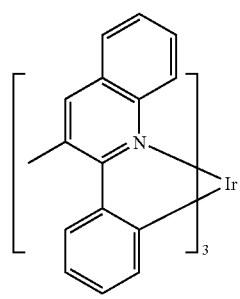 | US07087321 |
| | 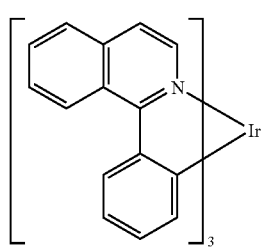 | US07087321 |

| MATERIAL | EXAMPLES OF MATERIAL | PUBLICATIONS |
|---|---|---|
| | 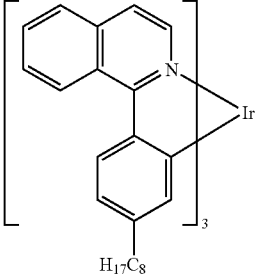 | Adv. Mater. 19, 739 (2007) |
| Platinum(II) organometallic complexes | 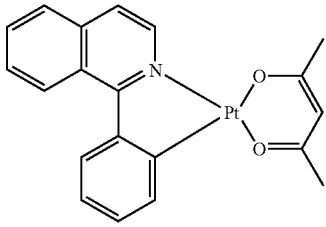 | WO2003040257 |
| Osminum(III) complexes | 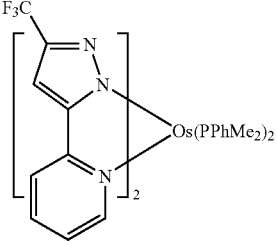 | Chem. Mater. 17, 3532 (2005) |
| Ruthenium(II) complexes | 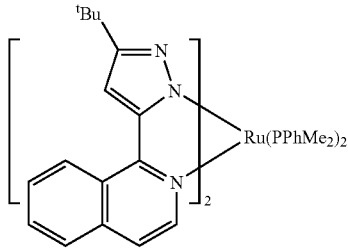 | Adv. Mater. 17, 1059 (2005) |
Green dopants
| | | |
|---|---|---|
| Iridium(III) organometallic complexes | 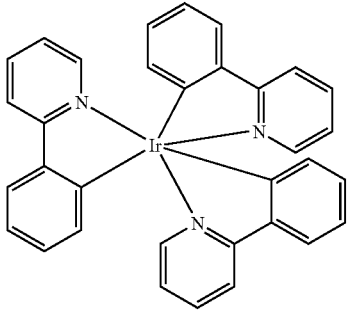
and its derivatives | Inorg. Chem. 40, 1704 (2001) |

| MATERIAL | EXAMPLES OF MATERIAL | PUBLICATIONS |
|---|---|---|
| | 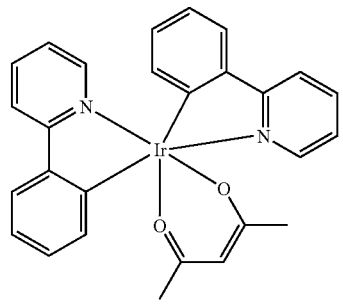 | US2002034656 |
| | 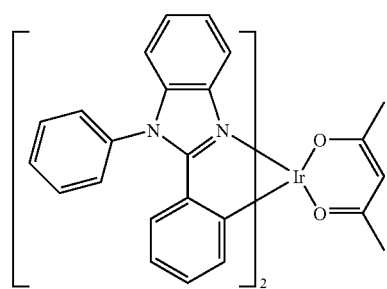 | US06687266 |
| | 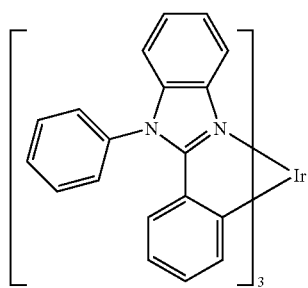 | Chem. Mater. 16, 2480 (2004) |
| | 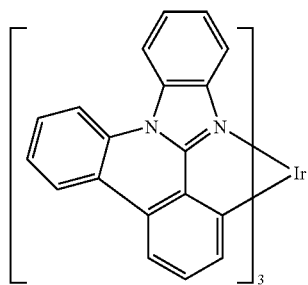 | US2007190359 |
| | 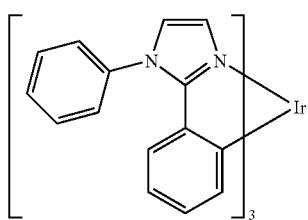 | US 2006008670 JP2007123392 |

-continued

| MATERIAL | EXAMPLES OF MATERIAL | PUBLICATIONS |
|---|---|---|
|  |  | Adv. Mater. 16, 2003 (2004) |
|  |  | Angew. Chem. Int. Ed. 2006, 45, 7800 |
| Pt(II) organometallic complexes |  | Appl. Phys. Lett. 86, 153505 (2005) |
|  |  | Appl. Phys. Lett. 86, 153505 (2005) |
|  |  | Chem. Lett. 34, 592 (2005) |

| MATERIAL | EXAMPLES OF MATERIAL | PUBLICATIONS |
|---|---|---|
| Gold complexes | | Chem. Commun. 2906 (2005) |
| Rhenium(III) complexes | | Inorg. Chem. 42, 1248 (2003) |
| Blue dopants | | |
| Iridium(III) organometallic complexes | | WO2002002714 |
| | | WO2006009024 |
| | | US2006251923 |
| | | WO2006056418, US2005260441 |

| MATERIAL | EXAMPLES OF MATERIAL | PUBLICATIONS |
|---|---|---|
| | 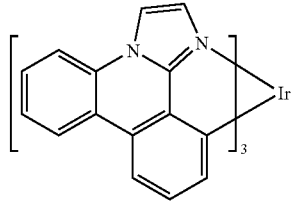 | US2007190359 |
| | 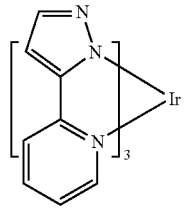 | US2002134984 |
| | 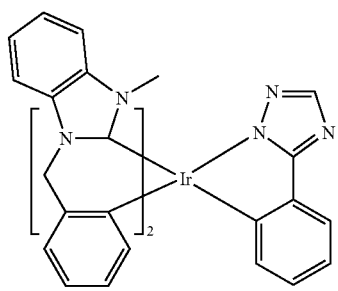 | Angew. Chem. Int. Ed. 47, 1 (2008) |
| | 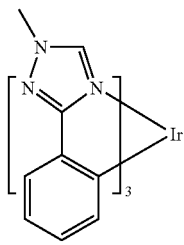 | Chem. Mater. 18, 5119 (2006) |
| | 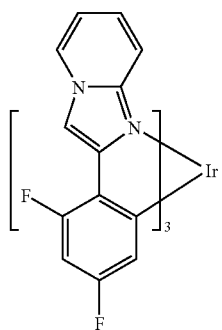 | Inorg. Chem. 46, 4308 (2007) |
| | 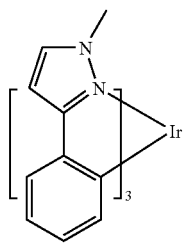 | WO05123873 |

| MATERIAL | EXAMPLES OF MATERIAL | PUBLICATIONS |
|---|---|---|
| | 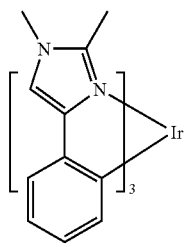 | WO05123873 |
| | 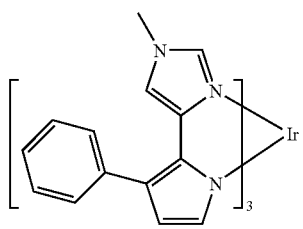 | WO07004380 |
| | 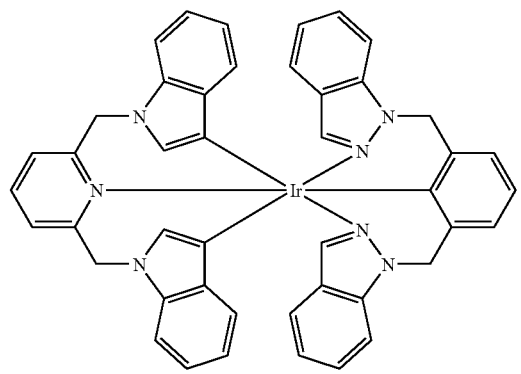 | WO06082742 |
| Osmium(II) complexes | 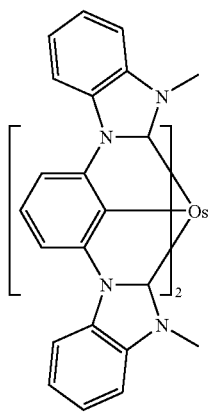 | US2005260449 |
| | 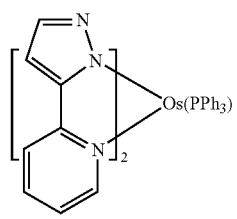 | Organometallics 23, 3745 (2004) |
| Gold complexes | 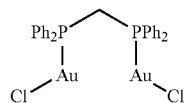 | Appl. Phys. Lett. 74, 1361 (1999) |

| MATERIAL | EXAMPLES OF MATERIAL | PUBLICATIONS |
|---|---|---|
| Platinum(II) complexes | 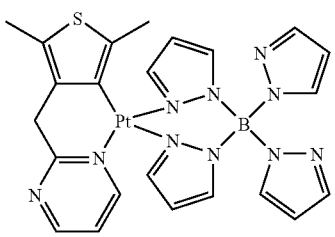 | WO06098120, WO06103874 |
| Exciton/hole blocking layer materials | | |
| Bathocuprine compounds (e.g., BCP, BPhen) | 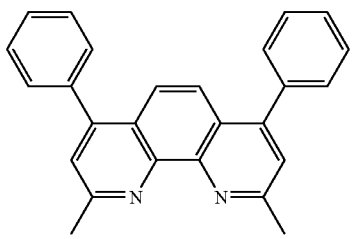 [SMILES: Cc1cc(-c2ccccc2)c2ccc3c(-c4ccccc4)cc(C)nc3c2n1] | Appl. Phys. Lett. 75, 4 (1999) |
| | 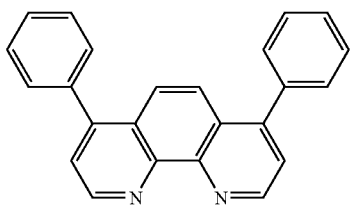 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 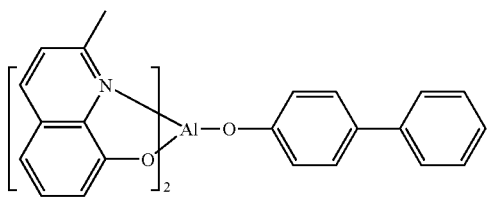 | Appl. Phys. Lett. 81, 162 (2002) |
| 5-member ring electron deficient heterocycles such as triazole, oxadiazole, imidazole, benzoimidazole | 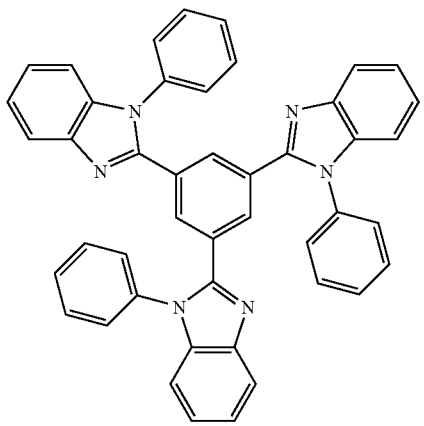 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

| MATERIAL | EXAMPLES OF MATERIAL | PUBLICATIONS |
|---|---|---|
| Triphenylene compounds | | US20050025993 |
| Fluorinated aromatic compounds | | Appl. Phys. Lett. 79, 156 (2001) |
| Electron transporting materials | | |
| Anthracene-benzoimidazole compounds | | WO03060956 |
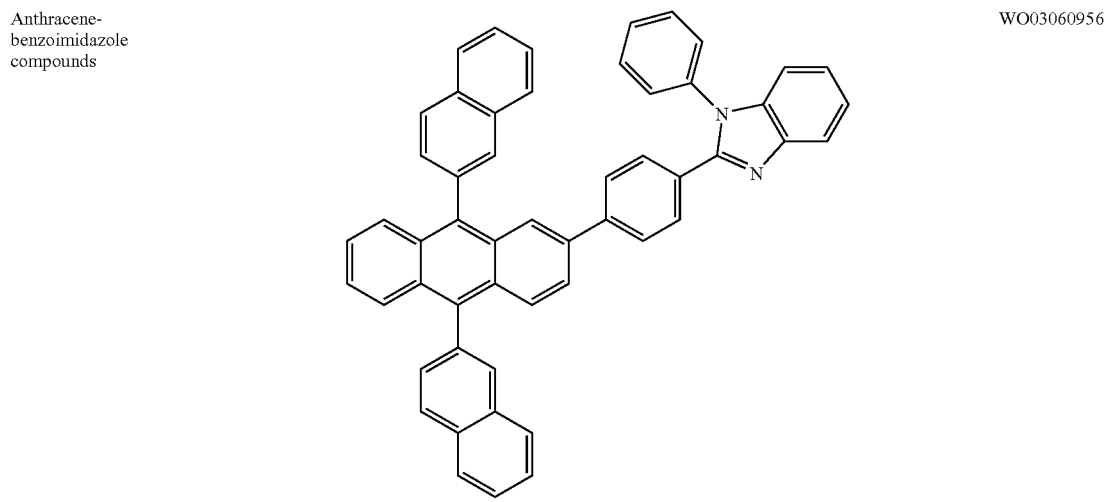

-continued

| MATERIAL | EXAMPLES OF MATERIAL | PUBLICATIONS |
| --- | --- | --- |
| Anthracene-benzothiazole compounds | | Appl. Phys. Lett. 89, 063504 (2006) |
| Metal 8-hydroxyquinolates (e.g., $Alq_3$) | | Appl. Phys. Lett. 51, 913 (1987) |
| Metal hydroxybenoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |

| MATERIAL | EXAMPLES OF MATERIAL | PUBLICATIONS |
|---|---|---|
| | | Appl. Phys. Lett. 55, 1489 (1989) |
| | | Jpn. J. Apply. Phys. 32, L917 (1993) |
| Silole compounds | | Org. Electron. 4, 113 (2003) |
| Arylborane compounds | | J. Am. Chem. Soc. 120, 9714 (1998) |
| Fluorinated aromatic | | J. Am. Chem. Soc. 122, 1832 (2000) |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device, comprising:
   an anode;
   a cathode;
   an intermediate connector disposed between the anode and the cathode, the intermediate connector comprising:
   a first metal having a work function lower than 4.0 eV; and
   a second metal having a work function lower than 5.0 eV;
   wherein the work function of the first metal is at least 0.5 eV less than the work function of the second metal;

a first layer consisting essentially of the first metal, the first layer being in direct contact with the first sublayer of the second organic layer; and
a second layer consisting essentially of the second metal, the second layer being in direct contact with the first layer, and disposed closer to the anode than the first layer;

a first organic layer disposed between the anode and the intermediate connector, the first organic layer further comprising a first organic emissive material;

a second organic layer disposed between the intermediate connector and the cathode, the second organic layer comprising a plurality of sublayers, including a first sublayer of the second organic layer and a second sublayer of the second organic layer;

the first sublayer of the second organic layer being in direct contact with the intermediate connector, and comprising a material having the structure:

wherein $R_1$-$R_6$ are independently chosen from the group consisting of hydrogen, halo, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—CO—OR), amide (—CO—NHR or —CO—NRR'), straight-chain or branched (substituted or unsubstituted) $C_1$-$C_{12}$ alkoxy, straight-chain or branched (substituted or unsubstituted) $C_1$-$C_{12}$ alkyl, aromatic or non-aromatic (substituted or unsubstituted) heterocyclic, substituted or unsubstituted aryl, mono- or di-(substituted or unsubstituted)aryl-amine, (substituted or unsubstituted)alkyl-(substituted or unsubstituted)aryl-amine, and substituted or unsubstituted electron withdrawing substituent groups, where R and R' are independently selected from substituted or unsubstituted $C_1$-$C_{60}$ alkyl, substituted or unsubstituted aryl, substituted or unsubstituted 5-7 membered heterocyclic, where substituted $C_1$-$C_{60}$ alkyl, aryl and heterocyclic are optionally substituted with one or more of amine, amide, ether and ester groups, and where aryl groups includes phenyl, biphenyl, terphenyl, naphthyl, anthracenyl, tetracenyl, pentacenyl, perylenyl and coronenyl, which are singly or multiply substituted or unsubstituted; and the second sublayer of the second organic layer comprising a second organic emissive material;

wherein the first layer is in direct contact with the first sublayer of the second organic layer.

2. The device of claim 1, wherein the intermediate connector further comprises a third layer in contact with the second layer, the third layer being disposed closer to the anode than the second layer, the third layer comprising a metal halide or metal oxide.

3. The device of claim 2, wherein the metal halide or metal oxide is LiF, the first metal is Ca, and the second metal is Al.

4. The device of claim 1, wherein the intermediate connector further comprises:
a first layer consisting essentially of the first metal, the first layer in direct contact with the first sublayer of the second organic layer;
a second layer consisting essentially of the second metal, the second layer being in direct contact with the first layer, and disposed closer to the anode than the first layer;
a third layer in contact with the second layer, the third layer being disposed closer to the anode than the second layer, the third layer comprising a metal halide or metal oxide;
a fourth layer consisting essentially of the first metal, the fourth layer in direct contact with the third layer, and disposed closer to the anode than the third layer;
a fifth layer consisting essentially of the second metal, the fifth layer being in direct contact with the fourth layer, and disposed closer to the anode than the fourth layer; and
a sixth layer in contact with the fifth layer, the sixth layer being disposed closer to the anode than the fifth layer, the sixth layer comprising a metal halide or metal oxide.

5. The device of claim 1, wherein the first organic emissive material is a fluorescent material, and the second organic emissive material is a phosphorescent material.

6. The device of claim 5, wherein the first organic emissive material is a fluorescent material having a peak emissive wavelength in the visible spectrum that is less than 550 nm, and the second organic emissive material is a phosphorescent emissive material having a peak emissive wavelength in the visible spectrum that is greater than 550 nm.

7. The device of claim 6, wherein the device emits light having a CRI greater than 89.

8. The device of claim 1, wherein the intermediate connector is non-addressable.

9. The device of claim 1, wherein the first organic layer further comprising a plurality of sublayers, including a first sublayer of the first organic layer and a second sublayer of the first organic layer;
the first sublayer of the first organic layer is in direct contact with the intermediate connector;
the first sublayer of the first organic layer is not conductivity doped; and
the first sublayer of the second organic layer is not conductivity doped.

10. The device of claim 2, wherein the first sublayer of the second organic layer comprises a material having the structure:

11. A consumer product comprising a device, the device further comprising:
an anode;
a cathode;
an intermediate connector disposed between the anode and the cathode, the intermediate connector comprising:
a first metal having a work function lower than 4.0 eV; and
a second metal having a work function lower than 5.0 eV;
wherein the work function of the first metal is at least 0.5 eV less than the work function of the second metal;

a first layer consisting essentially of the first metal, the first layer being in direct contact with the first sublayer of the second organic layer; and a second layer consisting essentially of the second metal, the second layer being in direct contact with the first layer, and disposed closer to the anode than the first layer;

a first organic layer disposed between the anode and the intermediate connector, the first organic layer further comprising a first organic emissive material;

a second organic layer disposed between the intermediate connector and the cathode, the second organic layer comprising a plurality of sublayers, including a first sublayer of the second organic layer and a second sublayer of the second organic layer;

the first sublayer of the second organic layer being in direct contact with the intermediate connector, and comprising a material having the structure:

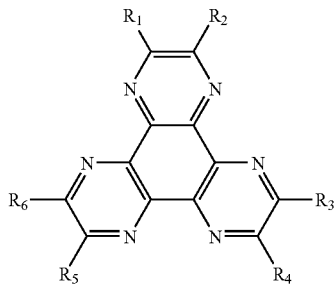

wherein $R_1$-$R_6$ are independently chosen from the group consisting of hydrogen, halo, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—CO—OR), amide (—CO—NHR or —CO—NRR'), straight-chain or branched (substituted or unsubstituted) $C_1$-$C_{12}$ alkoxy, straight-chain or branched (substituted or unsubstituted) $C_1$-$C_{12}$ alkyl, aromatic or non-aromatic (substituted or unsubstituted) heterocyclic, substituted or unsubstituted aryl, mono- or di-(substituted or unsubstituted)aryl-amine, (substituted or unsubstituted)alkyl-(substituted or unsubstituted)aryl-amine, and substituted or unsubstituted electron withdrawing substituent groups, where R and R' are independently selected from substituted or unsubstituted $C_1$-$C_{60}$ alkyl, substituted or unsubstituted aryl, substituted or unsubstituted 5-7 membered heterocyclic, where substituted $C_1$-$C_{60}$ alkyl, aryl and heterocyclic are optionally substituted with one or more of amine, amide, ether and ester groups, and where aryl groups includes phenyl, biphenyl, terphenyl, naphthyl, anthracenyl, tetracenyl, pentacenyl, perylenyl and coronenyl, which are singly or multiply substituted or unsubstituted; and the second sublayer of the second organic layer comprising a second organic emissive material wherein the first metal is in direct contact with the first sublayer of the second organic layer.

* * * * *